United States Patent
Otabe et al.

(10) Patent No.: US 6,855,973 B2
(45) Date of Patent: Feb. 15, 2005

(54) SEMICONDUCTOR MEMORY DEVICE INCLUDING A CAPACITOR AN UPPER ELECTRODE OF WHICH BEING RESISTANT OF EXFOLIATION

(75) Inventors: Takuya Otabe, Fukuyama (JP); Masaya Nagata, Yokohama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/246,773

(22) Filed: Sep. 19, 2002

(65) Prior Publication Data
US 2003/0057463 A1 Mar. 27, 2003

(30) Foreign Application Priority Data
Sep. 21, 2001 (JP) ........................ 2001-289120

(51) Int. Cl.[7] ........................ H01L 29/76; H01L 27/108
(52) U.S. Cl. ........................ 257/295; 257/296; 257/298; 257/310
(58) Field of Search ................ 257/66–68, 71, 257/295–310, E21.664, 905–908

(56) References Cited

U.S. PATENT DOCUMENTS 5,434,102 A * 7/1995 Watanabe et al. ........... 437/130
6,236,076 B1 * 5/2001 Arita et al. ................. 257/295
2001/0011743 A1 * 8/2001 Arita et al. ................. 257/314

FOREIGN PATENT DOCUMENTS

JP 08-023073 1/1996

* cited by examiner

Primary Examiner—Nathan J. Flynn
Assistant Examiner—Johannes Mondt
(74) Attorney, Agent, or Firm—Nixon & Vanderhye P.C.

(57) ABSTRACT

On a silicon substrate 201, there are formed a silicon oxide 202, an adhesion layer 203 consisting of $TiO_2$, a lower electrode 204 consisting of Pt, a ferroelectric thin film 205, and an upper electrode 206 consisting of Pt. A portion of the ferroelectric thin film adjacent to the upper electrode 206 is formed from a compound with a composition formula of $SrBi_2(Ta_xNb_{1-x})_2O_9$ where x=0.7. A compound with a value x in the composition formula being greater than 0.7 is used for the portion of the ferroelectric thin film adjacent to the upper electrode 206, so as to generate an appropriate number of grain boundaries on the surface of the ferroelectric film 205, the grain boundaries enabling implementation of anchoring effect between the ferroelectric film 205 and the upper electrode 206, thereby achieving prevention of exfoliation of the upper electrode 206 from the ferroelectric film 205. Therefore, the semiconductor memory device is free from exfoliation of the upper electrode film from the dielectric film and has a good yield.

6 Claims, 4 Drawing Sheets

SEMICONDUCTOR MEMORY DEVICE INCLUDING A CAPACITOR AN UPPER ELECTRODE OF WHICH BEING RESISTANT OF EXFOLIATION

BACKGROUND OF THE INVENTION

The present invention relates to a semiconductor memory device.

Conventionally, a number of functions of a dielectric including spontaneous polarization, high permittivity, electro-optic effect, piezoelectric effect, and pyroelectric effect have been applied to various devices. For example, pyroelectric effect of a dielectric is utilized for infrared linear ray sensors, piezoelectric effect is utilized for ultrasonic sensors, electro-optic effect is utilized for waveguiding optical modulators, and high permittivity is utilized for capacitors for DRAM (Dynamic Random Access Memory) and MMIC (Monolithic Microwave Integrated Circuit).

In recent years, a semiconductor memory is combined with a dielectric by using rapidly-developed thin film formation technique to develop FRAM (Ferroelectronic non-volatile memory) having high density and enabling high-speed operation. The non-volatile memory using a ferroelectric is high in write and read speed, low in operating voltage, and high in write and read tolerance, so that vigorous research and development is underway for its practical use not only as a substitute for a conventional non-volatile memory,but also as a memory capable of substituting for SRAM (Static Random Access Memory) and DRAM. A ferroelectric for use in such FRAM is required to be high in remanence, small in resistive electric field, low in leakage current, and high in tolerance for repeated polarization reversal.

As such ferroelectric, those using an oxide material with perovskite structure typified by PZT (Pb (Ti, Zr)$O_3$: lead zirconate titanate) have been mainly used. However, there is generated such problem as increase of leakage current in a dielectric film and occurrence of a fatigue phenomenon in which spontaneous polarization is decreased by repetition of polarization reversal. Particularly, for substituting FRAM for DRAM, characteristics of the dielectric film of a capacitor is required to be unchanged with polarization reversal being performed $10^{15}$ times, by which the fatigue phenomenon becomes a serious problem in formation of DRAM and FRAM.

In recent years, a ferroelectric film with use of a compound having bismuth laminar structure is also being researched and developed. Specifically, a compound having bismuth laminar structure expressed by a composition formula of $SrBi_2$ $(Ta_xNb_{1-x})_2O_9$ ($0 \leq x \leq 1$), i.e., SBTN, has a large polarization value and provides a square-shaped good polarization hysteresis against changes of electric fields, and decrease of dielectric polarization due to fatigue is scarcely seen. Accordingly, there has been proposed a semiconductor memory device having a capacitor using the SBTN (see Japanese Patent Laid-Open Publication No. HEI 8-23073). FIG. 5 is a schematic view showing the capacitor of the semiconductor memory device. The capacitor is composed of a lower electrode film 102, a dielectric film 103 consisting of SBTN, and an upper electrode film 104 formed in sequence on a ground layer 101. The upper electrode film 104 adheres to the dielectric film 103 by an anchoring effect generated by a portion of the upper electrode film 104 entering into recesses 105, 105 . . . formed by a grain portion on the surface of the dielectric film 103. It is noted that the recesses 105, 105 . . . on the dielectric film 103 are magnified in FIG. 5.

In the conventional semiconductor memory device, however, increase in composition percentage of Nb (niobium) among composition of SBTN forming a ferroelectric film of a capacitor increases a value of remanence of the ferroelectric film, and enlarges a diameter of grains composing the ferroelectric film, resulting in decrease in number of grain boundaries in the ferroelectric film. Consequently, increasing composition percentage of Nb among the SBTN for increasing capacity of the capacitor reduces a grain boundary portion of the dielectric film 103. This decreases the recess portion of the grain boundary of the dielectric film 103 into which the upper electrode film 104 enters, and thereby reduces adhesion of the dielectric film 103 and the upper electrode film 104. As a result, in heat treatment process and chemical treatment process after formation of the upper electrode film 104, exfoliation of the upper electrode film 104 occurs, which leads to decrease of a manufacturing yield of the semiconductor memory device.

SUMMARY OF THE INVENTION

Accordingly, it is an object of the present invention to provide a semiconductor memory device that is free from exfoliation of an upper electrode film from a dielectric film and that is good in yield.

In order to achieve the above object, there is provided a semiconductor memory device including a capacitor having a lower electrode film, a dielectric film, and an upper electrode film disposed in sequence from a substrate side, wherein a portion of the dielectric film adjacent to the upper electrode film is different in composition from the other portions of the dielectric film.

According to the above structure, if in the above-stated other portions of the dielectric film, composition with large remanence is imparted and therefore a diameter of grains composing the dielectric film enlarges, the portion adjacent to the upper electrode film has composition different from the other portions, so that a grain diameter will not enlarge. This prevents a grain boundary portion in the dielectric film portion adjacent to the upper electrode film from reducing. Consequently, decrease of recess of the grain boundary of the dielectric film, into which a portion of the upper electrode film enters, is prevented, resulting in prevention of decrease in adhesion of the dielectric film and the upper electrode film. As a consequence, in the heat treatment process and the chemical treatment process after formation of the upper electrode film, the upper electrode film will not exfoliate, which makes it possible to manufacture the semiconductor memory device with a good yield.

In one embodiment of the present invention, the portion of the dielectric film adjacent to the upper electrode film has composition gradually changed in a thickness direction.

According to the above embodiment, the portion of the dielectric film adjacent to the upper electrode film has composition gradually changed in the thickness direction. Therefore, there is no boundary with large composition difference between the portion adjacent to the upper electrode film and the other portions, so that there is generated no disadvantage such as electric breakdown of the dielectric film, thereby enabling provision of a semiconductor memory device having good reliability.

In one embodiment of the present invention, the dielectric film has composition expressed by a composition formula of $SrBi_2$ $(Ta_xNb_{1-x})_2O_9$ ($0 \leq x \leq 1$), and a value of x in the composition formula is different between the portion adjacent to the upper electrode film and the other portions.

According to the above embodiment, values of x in the composition formula for the portion adjacent to the upper electrode film and the other portions are specified values different from each other, so that, for example, increase of a value of remanence in the other portions is possible, and enlargement of grain boundary of the portion adjacent to the upper electrode film may be prevented. Therefore, the other portions can make the dielectric film have relatively large remanence to achieve good characteristics, while the portion adjacent to the upper electrode film makes it possible to obtain good adhesion with the upper electrode film. Therefore, the semiconductor memory device with good characteristics may be manufactured with a good yield.

In one embodiment of the present invention, the portion of the dielectric film adjacent to the upper electrode film has composition with the value of x in the composition formula being not less than 0.7.

According to the above embodiment, the portion of the dielectric film adjacent to the upper electrode film has composition with the value of x in the composition formula being not less than 0.7.

Therefore, the portion of the dielectric film adjacent to the upper electrode film is imparted a relatively small grain diameter, so as to form an appropriate number of grain boundaries on the surface of the dielectric film. Eventually, a portion of the upper electrode enters into recess of the grain boundary of the dielectric film, thereby providing good adhesion between the upper electrode and the dielectric film.

In one embodiment of the present invention, in the dielectric film, a thickness of the portion adjacent to the upper electrode film is not less than 5 nm.

According to the above embodiment, in the dielectric film, a thickness of the portion adjacent to the upper electrode film is not less than 5 nm.

Therefore, appropriate recess given by the grain boundary is formed on the surface of the dielectric film adjacent to the upper electrode film, which ensures adhesion of the dielectric film and the upper electrode film.

In one embodiment of the present invention, the upper electrode film contains at least any one of Pt, Ir, and $IrO_2$.

According to the above embodiment, the upper electrode film contains at least any one of Pt (platinum), Ir (iridium), and $IrO_2$ (iridium oxide), which enables the upper electrode film to adhere to the dielectric film with good adhesion.

In one embodiment of the present invention, the dielectric film is formed by a spin coating method.

According to the above embodiment, the dielectric film is swiftly and easily formed by a spin coating method.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention will be described in detail in conjunction with the embodiments with reference to accompanying drawings.

(First Embodiment)

Figure 1:
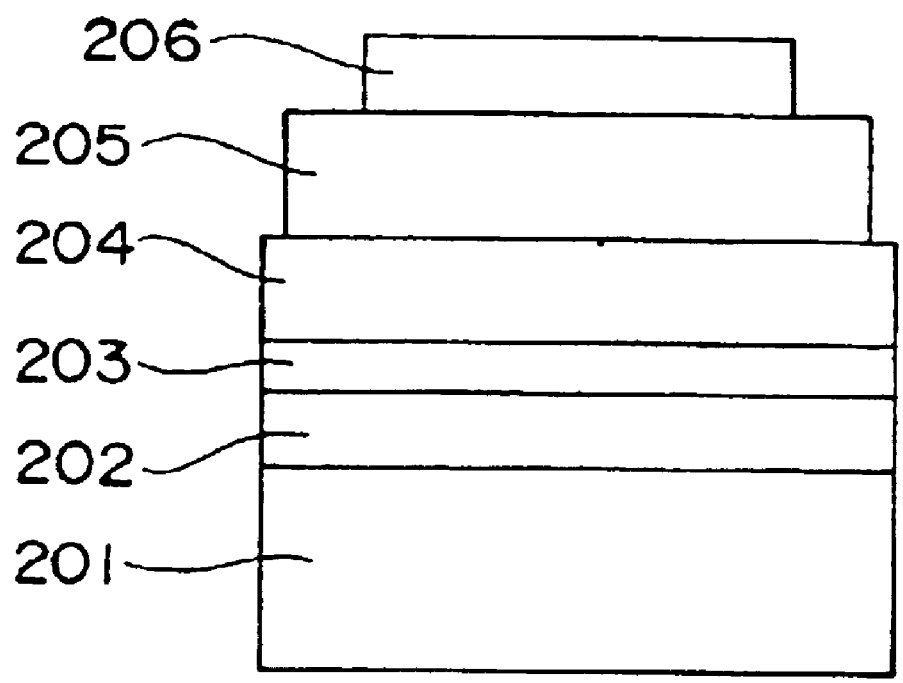
FIG. 1 is a view showing a capacitor provided with a semiconductor memory device of the present invention.

FIG. 1 is a view showing a capacitor provided with a semiconductor memory device of the present invention. The capacitor has a silicon substrate 201, on which a silicon oxide 202, an adhesion layer 203 consisting of $TiO_2$, a lower electrode 204 as a lower electrode film consisting of Pt, a ferroelectric thin film 205 as a dielectric film, and an upper electrode 206 as an upper electrode film consisting of Pt are disposed. In the present embodiment, composition of a portion of the ferroelectric film adjacent to the upper electrode 206 is changed to form eight kinds of different ferroelectric thin films 205, on each of which an upper electrode 206 is formed for performing an experiment about adhesion between the ferroelectric thin film 205 and the upper electrode 206.

First, on a silicon substrate 201, there is formed a silicon oxide 202 with a film thickness of 300 nm by thermal oxidation, on which $TiO_2$ is laminated by sputtering to form an adhesion layer 203. On the adhesion layer 203, there is formed a lower electrode 204 consisting of Pt, on which a ferroelectric thin film 205 is formed by MOD (Metal Organic Decomposition).

In forming the ferroelectric thin film 205, first, $SrBi_2Nb_2O_9$, i.e., a precursor solution of a compound (hereinafter referred to as SBN) with a composition formula of $SrBi_2 (Ta_xNb_{1-x})_2O_9$ (hereinafter referred to as SBTN) where x=0, is applied onto the lower electrode 204 so as to have a thickness of 30 nm by a spin coating method. The applied precursor solution of SBN is dried for 5 minutes at a temperature of 250° C., and then subjected to thermal treatment in oxygen atmosphere for crystallization. The thermal treatment is executed for 30 minutes at a substrate temperature of 700° C. The step of SBN application to crystallization is repeated 6 times to obtain an SBN film having a film thickness of approx. 180 nm. On the SBN film, a precursor solution of a compound with a composition formula of $SrBi_2 (Ta_xNb_{1-x})_2O_9$ is applied so as to have a thickness of approx. 30 nm by a spin coating method. Herein, values x in the composition formula of SBTN are changed from 0.1 to 1.0 in increments of 0.1 to set eight kinds of values x. Thus-provided eight kinds of SBTN precursor solutions are each applied onto the SBN film. Then the film is dried for 5 minutes at a temperature of 250° C., and is subjected to thermal treatment in oxygen atmosphere at a substrate temperate of 700° C. for a calcination period of 30 minutes for crystallization. Thus, there are obtained eight kinds of ferroelectric thin films 205 with a thickness of 210 nm having a portion adjacent to the upper electrode 206 whose composition is different.

Figure 2:
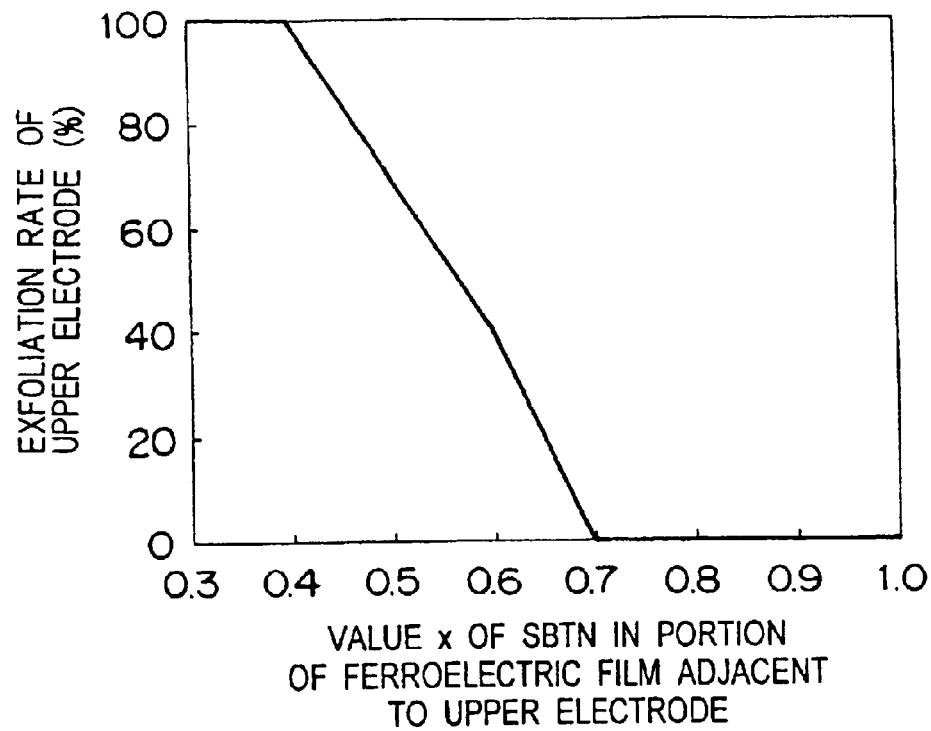
FIG. 2 is a view showing a relation between a value x of SBTN in a portion of a ferroelectric film 205 adjacent to an upper electrode 206 and an exfoliation rate of the upper electrode 206 from the ferroelectric film 205.

On the ferroelectric thin film 205, Pt is grown by sputtering and given a shape of 60 $\mu$m×60 $\mu$m by dry etching to form 10,000 upper electrodes 206. After formation of the upper electrode 206, thermal treatment is performed in oxygen atmosphere at a substrate temperature of 700° C. for a calcination period of 30 minutes. Thereafter, with use of an optical microscope, exfoliation of the upper electrode 206 from the ferroelectric thin film 205 is observed and the number of the upper electrodes 206 exfoliated from the ferroelectric thin film 205 is counted. Then, a percentage of exfoliated upper electrodes 206 to 10,000 upper electrodes 206 (hereinbelow referred to as an exfoliation rate) is calculated. FIG. 2 is a view showing a relation between a value x of SBTN in a portion of the ferroelectric film 205 adjacent to an upper electrode 206 and an exfoliation rate of the upper electrode 206. In FIG. 2, a horizontal axis indicates a value x of SBTN in a portion of the ferroelectric film 205 adjacent to the upper electrode 206, whereas a vertical axis indicates an exfoliation rate (%) of the upper electrode 206. As shown in FIG. 2, when the value x of SBTN is less than 0.7, exfoliation of the upper electrode 206 occurs. When the value x of SBTN is 0.7 or more, no exfoliation occurs. Therefore, by setting the value x in the composition formula of SBTN in a portion of the ferroelectric film 205 adjacent to the upper electrode 206 to be 0.7 or more, exfoliation of the upper electrode 206 may be restrained.

(Second Embodiment)

In the second embodiment of the present invention, there are formed ferroelectric films 205 with a portion each having a different value x of SBTN whose thickness is changed for performing an experiments about adhesion of the ferroelectric film 205 and the upper electrode 206. In this embodiment, a capacitor having structure approximately identical to that of FIG. 1 is formed. More particularly, like the first embodiment, on the silicon substrate 201, there are formed a silicon oxide 202, an adhesion layer 203 consisting of $TiO_2$, a lower electrode 204 as a lower electrode film consisting of Pt, a ferroelectric thin film 205 as a dielectric film, and an upper electrode 206 as an upper electrode film consisting of Pt.

In the present embodiment, in forming the ferroelectric thin film 205, first, lamination of an SBN layer with a thickness of 30 nm is repeated 6 times to obtain an SBN film of 180 nm as with the case of forming the ferroelectric film 205 of the first embodiment. On the SBN film, there is applied $SrBi_2(Ta_3Nb_{0.7})_2O_9$, i.e., a precursor solution of a compound with a composition formula of SBTN where x=0.3, by a spin coating method. Then, the solution is dried for 5 minutes at a temperature of 250° C., and then subjected to thermal treatment in oxygen atmosphere at a substrate temperature of 700° C. for calcination period of 30 minutes for crystallization. Herein, an application thickness of the precursor solution of SBTN is set in seven kinds including 1 nm, 3 nm, 5 nm, 10 nm, 20 nm, 30 nm, and 50 nm to obtain seven kinds of ferroelectric films 205.

Figure 3:
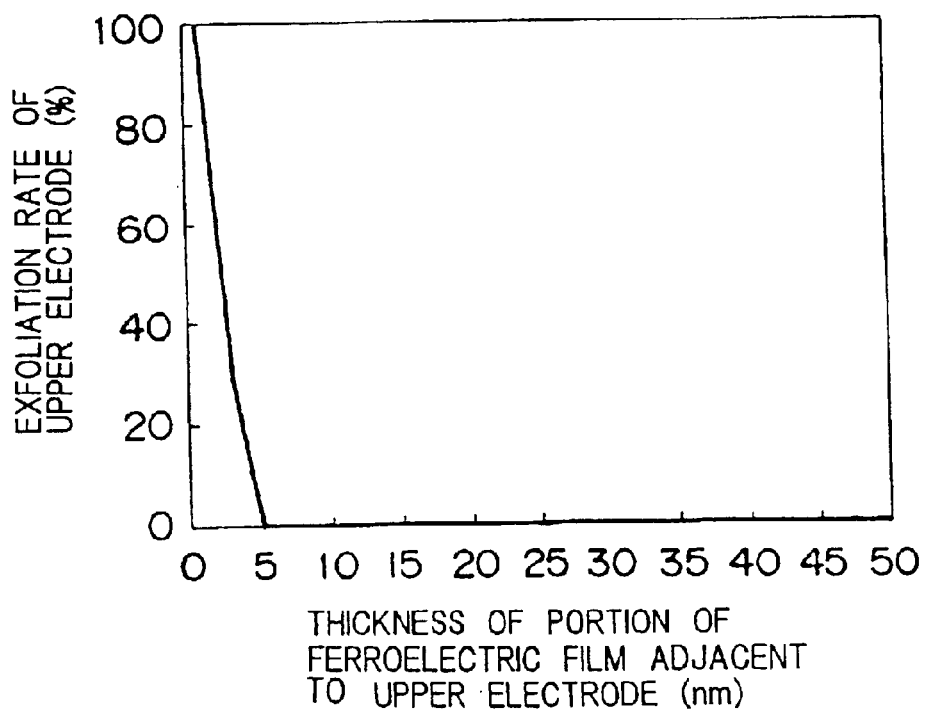
FIG. 3 is a view showing a relation between a thickness of a portion of the ferroelectric film 205 adjacent to the upper electrode 206 and an exfoliation rate of the upper electrode 206 from the ferroelectric film 205.

On the ferroelectric thin film 205, Pt is grown by sputtering like the first embodiment, and the Pt is given a size of 60 μm×60 μm by dry etching to form 10,000 upper electrodes 206. A capacitor with the electrode 206 formed is subjected to thermal treatment in oxygen atmosphere at a substrate temperature of 700° C. for a calcination period of 30 minutes, and with use of an optical microscope, the number of the upper electrodes 206 exfoliated from the ferroelectric thin film 205 is counted to calculate an exfoliation rate. FIG. 3 is a view showing a relation between a thickness of a portion of the ferroelectric film 205 adjacent to the upper electrode 206 and an exfoliation rate of the upper electrode 206. In FIG. 3, a horizontal axis indicates a thickness (nm) of a portion of the ferroelectric film 205 adjacent to the upper electrode 206, whereas a vertical axis indicates an exfoliation rate (%) of the upper electrode 206. As shown in FIG. 3, when a thickness of a portion of the ferroelectric film 205 adjacent to the upper electrode 206, that is an application thickness of a precursor solution of SBTN, is less than 5 nm, exfoliation of the upper electrode 206 occurs. This is considered to be because with a film thickness of the portion of the ferroelectric film 205 adjacent to the upper electrode 206 being less than 5 nm, a film is planarized in the film formation process, which removes recess of a grain boundary portion forming the film and thereby disables the portion of the upper electrode 206 entering therein, resulting in elimination of anchoring effect of the upper electrode 206 to the ferroelectric film 205. When a thickness of the portion of the ferroelectric film 205 adjacent to the upper electrode 206 is 5 nm or more, no exfoliation occurs. Therefore, by setting a thickness of a portion of the ferroelectric film 205 adjacent to the upper electrode 206 to be 5 nm or more, exfoliation of the upper electrode 206 may be restrained.

(Third Embodiment)

Figure 4:
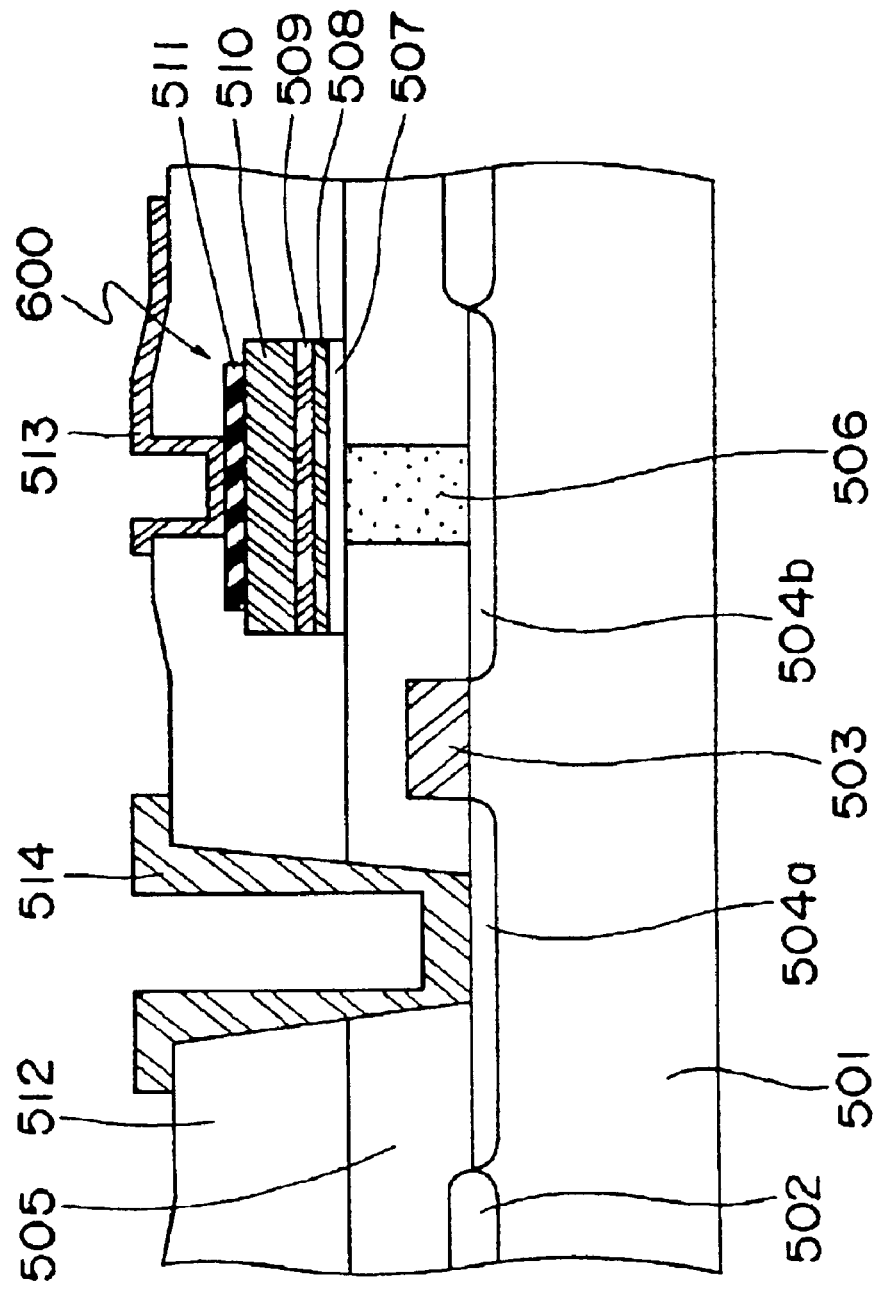
FIG. 4 is a view showing a semiconductor memory device in a third embodiment of the present invention.
Figure 5:
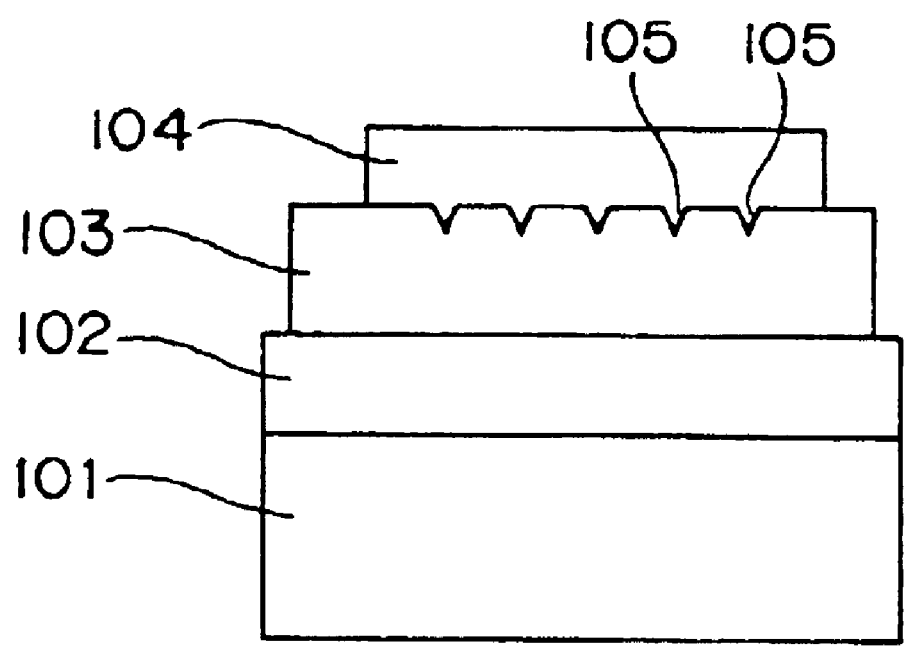
FIG. 5 is a schematic view showing a capacitor of a conventional semiconductor memory device.

FIG. 4 is a view showing a semiconductor memory device in a third embodiment of the present invention. This semiconductor memory device is a stack-type semiconductor memory device. The semiconductor memory device is formed as shown below. First, on the surface of a silicon substrate 501, there is formed a LOCOS film with a film thickness of approx. 5,000 Å to produce an element isolation area. Next, there is formed a selective transistor composed of a gate electrode 503, a source area 504a, and a drain area 504b, and then a first silicon oxide 505 as an interlayer insulating film is formed to have a thickness of approx. 5,000 Å by a CVD (Chemical Vapor Deposition) method. Then, on the first silicon oxide 505, there is formed a contact hole with a diameter of approx. 0.6 μm, in which polysilicon is embedded by a CVD method. After that, the surface of the polysilicon is planarized by a CMP (Chemical Machine Polishing) method to form a polysilicon plug 506. After the polysilicon undergoes wet treatment with hydrofluoric acid, a Ti (titanium) film 507 with a film thickness of 200 Å is formed on the polysilicon plug 506 by a DC (Direct Current) magnetron sputtering method. On the Ti film 507, a $Ta_xSi_{1-x}Ny$ film 508 ($0.2 \leq x \leq 1$, $0 \leq y \leq 1$), that is a diffusion barrier film, is formed to have a film thickness of 500 Å by a DC reactive magnetron sputtering method. Next on the diffusion barrier film 508, an Ir (iridium) film 509 of 200 nm that functions as a lower electrode is formed by a DC magnetron sputtering method. Next on the Ir film 509, there is formed an SBTN film 510 by a spin coating method to form a ferroelectric thin film. The upper side portion of the SBTN film is formed such that a value x in the composition formula is 0.7 or more and a film thickness is 5 nm or more, like the first and the second embodiments. Next, after a Pt film with a film thickness of 1,000 Å is grown by a DC magnetron sputtering method, the Pt film is etched into a 1 to 3 μm square by a dry etching method with use of $Cl_2$ (chlorine) to form an upper electrode 511. After that, the SBTN film 510 below the upper electrode 511 is shaped by a dry etching method with use of $C_2F_6$ (fluorocarbon) and Ar (argon). Then thereafter, the lower electrode 509 consisting of Ir, the $Ta_xSi_{1-x}Ny$ diffusion barrier film 508, and the Ti film 507 are shaped by a dry etching method with use of $Cl_2$ and $C_2F_6$. Thus, there is formed a capacitor 600 made up of the lower electrode 509, the SBTN film 510 as a dielectric film, and the upper electrode 511.

After that, a second silicon oxide 512 as an interlayer insulating film is formed by a CVD method, and a contact hole penetrating the second silicon oxide 512 and reaching the surface of the upper electrode 511 is formed. Aluminum is sputtered over the inner surface of the contact hole and the surface of the second silicon oxide 512 by a DC magnetron sputtering method to from an extraction electrode 513 from the upper electrode 511 of the capacitor 600. Next, there is formed a contact hole that penetrates the second silicon oxide 512 and the first silicon oxide 505 and reaches a source injection area 504, and on the inner surface of the contact hole, an aluminum film is formed to form an extraction electrode 514 of the source area 504a of the transistor. Thus, a semiconductor memory device having a capacitor 600 with use of a ferroelectric as shown in FIG. 4 is completed.

In thus-produced semiconductor memory device, a voltage having a triangular fluctuating waveform is applied to between the extraction electrode 513 from the upper electrode 511 of the capacitor 600 and the extraction electrode 514 of the source area 504a, as a result of which a polarization hysteresis curve is obtained. The voltage of an applied triangle wave is 3V. Ferroelectric characteristics of the capacitor 600 are such that with applied voltage of 3V, $\Delta Q=15$ $\mu c \cdot cm^2$, leakage current density is $1 \times 10^{-7}$ $A \cdot cm^2$, and withstand voltage is 10 v or more. This indicates that the capacitor has sufficient ferroelectric characteristics. Also, in each step after formation of the upper electrode 511, as a result of observing exfoliation of the upper electrode 511 with use of an optical microscope, no exfoliation of the upper electrode 511 from the SBTN film 510 is seen.

In the above embodiment, a portion of the ferroelectric film 205 adjacent to the upper electrode 206 is formed from a compound with a composition formula of $SrBi_2(Ta_xNb_{1-x})_2O_9$ in which a value x is different from that of other portions of the ferroelectric film 205. However, the portion of the ferroelectric film 205 adjacent to the upper electrode 206 may be formed from a compound with a value x in the composition formula of $SrBi_2(Ta_xNb_{1-x})_2O_9$ being gradually varied in thickness direction.

In the above embodiment, a portion of the SBTN film 510 of the capacitor 600 adjacent to the upper electrode 511 may be also formed from a compound with a value x in the composition formula of $SrBi_2(Ta_xNb_{1-x})_2O_9$ being gradually varied in thickness direction.

Although in the above embodiment, an upper electrode 511 is formed with use of Pt on the SBTN film 510, the upper electrode 511 may contain Ir or $IrO_2$. By containing Pt, Ir, or $IrO_2$, the upper electrode 511 can adhere to the SBTN film 510 as a dielectric film with good adhesion.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device comprising:

a capacitor including a lower electrode film, a dielectric film, and an upper electrode film disposed in sequence from a substrate side, wherein a portion of the dielectric film adjacent to the upper electrode film is different in composition from the other portions of the dielectric film, and wherein the portion of the dielectric film adjacent to the upper electrode film comprises $SrBi_2(Ta_xNb_{1-x})_2O_9$, includes Nb in an amount where x is at least 0.7, and is at least 5 nm thick in order to improve adhesion of the upper electrode to the dielectric film, and wherein an amount of Nb is different in different parts of the dielectric film, so that the amount of Nb in the dielectric film is greater at a location further from the upper electrode film than at a location in the dielectric film closer to and adjacent to the upper electrode film.

2. The semiconductor memory device as defined in claim 1, wherein the portion of the dielectric film adjacent to the upper electrode film has composition gradually changed in a thickness direction.

3. The semiconductor memory device as defined in claim 1, wherein the upper electrode film contains at least any one of Pt, Ir, and $IrO_2$.

4. The semiconductor memory device as defined in claim 1, wherein the dielectric film is formed by a spin coating method.

5. The semiconductor memory device of claim 1, wherein the dielectric film further comprises another portion comprising $SrBi_2Nb_2O_9$ located under said portion comprising $SrBi_2(Ta_xNb_{1-x})_2O_9$, so that said portion of the dielectric film comprising $SrBi_2Nb_2O_9$ is located between said lower electrode and said portion of the dielectric film comprising $SrBi_2(Ta_xNb_{1-x})_2O_9$.

6. A semiconductor memory device comprising:

a capacitor including a lower electrode film, a dielectric film, and an upper electrode film disposed in sequence from a substrate side, wherein a portion of the dielectric film adjacent to the upper electrode film is different in composition from the other portions of the dielectric film, and wherein the portion of the dielectric film adjacent to the upper electrode film comprises $SrBi_2(Ta_xNb_{1-x})_2O_9$, includes Nb in an amount where x is at least 0.7, and is at least 5 nm thick in order to improve adhesion of the upper electrode to the dielectric film, and wherein an amount of Nb is different in different parts of the dielectric film, so that the amount of Nb in the dielectric film is greater at a location further from the upper electrode film than at a location in the dielectric film closer to the upper electrode film.

* * * * *